US008456910B2

(12) United States Patent
Lukashevich

(10) Patent No.: US 8,456,910 B2
(45) Date of Patent: Jun. 4, 2013

(54) NONVOLATILE MEMORY CELL WITH WELL EXTENDING UNDER TRANSISTOR AND DATA STORAGE CAPACITOR OF MEMORY CELL

(75) Inventor: Dzianis Lukashevich, Munich (DE)

(73) Assignee: Infineon Technologies AG, Neubiberg (DE)

( * ) Notice: Subject to any disclaimer, the term of this patent is extended or adjusted under 35 U.S.C. 154(b) by 326 days.

(21) Appl. No.: 12/846,996

(22) Filed: Jul. 30, 2010

(65) Prior Publication Data

US 2012/0026793 A1 Feb. 2, 2012

(51) Int. Cl.
*G11C 14/00* (2006.01)
(52) U.S. Cl.
USPC .............. 365/185.08; 365/185.1; 365/185.18; 257/371
(58) Field of Classification Search
USPC .............. 365/185.08, 185.1, 185.18; 257/371
See application file for complete search history.

(56) References Cited

U.S. PATENT DOCUMENTS

| 5,453,949 | A |   | 9/1995  | Wiedmann et al. |
|-----------|---|---|---------|-----------------|
| 5,771,189 | A | * | 6/1998  | Jun et al. ................... 365/149 |
| 5,892,709 | A | * | 4/1999  | Parris et al. .............. 365/185.01 |
| 6,017,792 | A |   | 1/2000  | Sharma et al. |
| 6,087,211 | A |   | 7/2000  | Kalnitsky et al. |
| 6,330,190 | B1 |  | 12/2001 | Wang et al. |
| 6,509,606 | B1 |  | 1/2003  | Merrill et al. |
| 6,909,389 | B1 |  | 6/2005  | Hyde et al. |
| 6,985,386 | B1 | * | 1/2006  | Mirgorodski et al. ... 365/185.05 |
| 7,288,811 | B2 |  | 10/2007 | Tsunoda et al. |
| 7,570,257 | B2 | * | 8/2009  | Ikeda ............................ 345/204 |
| 7,691,702 | B2 |  | 4/2010  | Kapoor |
| 2002/0008271 | A1 |   | 1/2002  | Hsu et al. |
| 2006/0033143 | A1 |   | 2/2006  | Chen et al. |
| 2006/0216887 | A1 |   | 9/2006  | Hsieh et al. |
| 2008/0001199 | A1 |   | 1/2008  | Hoefler |
| 2008/0025109 | A1 |   | 1/2008  | Lee |

FOREIGN PATENT DOCUMENTS

WO  2009071965 A1  6/2009

OTHER PUBLICATIONS

U.S. Appl. No. 13/232,278, filed Sep. 14, 2011.
Dennis Walker, Jr., et al., "Characterization of Two Standard CMOS EEPROM Designs", IEEE 2001, Department of Electrical Engineering, The Ohio State University, p. 894-896.

* cited by examiner

*Primary Examiner* — Connie Yoha
(74) *Attorney, Agent, or Firm* — Eschweiler & Associates, LLC

(57) ABSTRACT

One embodiment relates to a memory device. The memory device includes a capacitor having a first capacitor plate and a second capacitor plate, wherein the first and second capacitor plates are separated by an insulating layer and are formed over a first portion of a semiconductor substrate. The memory device also includes a transistor having a source region, a drain region, and a gate region, where the gate region is coupled to the second capacitor plate. The transistor is formed over a second portion of the semiconductor substrate. A well region is disposed in the first and second portions of the semiconductor substrate and has a doping-type that is opposite a doping-type of the semiconductor substrate. Other embodiments are also disclosed.

12 Claims, 5 Drawing Sheets

NONVOLATILE MEMORY CELL WITH WELL EXTENDING UNDER TRANSISTOR AND DATA STORAGE CAPACITOR OF MEMORY CELL

BACKGROUND

There are many different types of memory used to store data. One type of memory is Electrically Erasable Programmable Read-Only Memory (EEPROM), which is used in many electronic products (e.g., to store calibration and customer specific data for industrial and automotive sensors). FIG. 1 shows a circuit schematic for a conventional EEPROM memory cell 100. The EEPROM memory cell 100 includes a first transistor 102 (e.g., typically an NMOS transistor) having a capacitor 104 coupled to its gate. A first plate of the capacitor (tied to a gate of the first transistor) can be referred to as a floating gate (FG), while a second plate of the capacitor can be referred to as a control gate (CG).

To write to the memory cell 100, voltages can be selectively applied to the control gate CG to add charge or subtract charge from the floating gate FG, thereby programming the memory cell to a desired data state. Because the floating gate FG is electrically isolated, any charge placed on the floating gate is trapped there and will remain there for an extended time period (e.g., years) or until it is removed by writing another data state to the cell. Thus, EEPROM cells are said to be non-volatile, because the data contents remain there even if power is disconnected from the cell.

For example, to write a first data state to the memory cell (e.g., a logical "1"), a relatively large voltage (e.g., 21 V for tunneling oxide thicknesses around 15 nm) can be applied to the control gate CG relative to the body of the first transistor 102 (e.g., held at 0V), thereby resulting in a predetermined amount of charge (e.g., electrons) being "trapped" on the floating gate FG via Fowler-Nordheim tunneling, for example. These electrons can decrease the electrical potential of the floating gate FG, for example, such that the potential of the FG is lower than a threshold voltage of the first transistor 102. Conversely, to write a second data state to the memory cell (e.g., a logical "0"), a relatively small voltage (e.g., 0V) can be applied to the control gate CG relative to the body of the first transistor (e.g., held at 21V), thereby removing electrons from the floating gate FG and increasing its potential to be higher than that of the voltage threshold of the first transistor 102. Also a negative voltage (e.g. −21V) can be applied to the control gate relative to the body of the first transistor in order to write a second data (e.g., a logical "0").

When the cell 100 is subsequently read, a suitable read bias is applied to a second transistor 106 also called the select transistor (e.g., NMOS transistor) to turn the second transistor on. The amount of current, if any, flowing over the second transistor 106 corresponds to the charge previously stored on the floating gate FG. For example, if a logical "1" is stored in the cell in our example (which corresponds to the potential of FG being less than the voltage threshold of the first transistor 102), a limited amount of current (almost no current or extremely low leakage current) will flow because the first transistor 102 is effectively "off". By contrast, if a logical "0" is stored in the cell 100 in our example (which corresponds to the potential of FG being greater than the voltage threshold of the first transistor 102), a significant amount of current will flow because the transistor 102 is "on". Thus, by measuring the current output, the state of the cell 100 can be determined. In other embodiments, voltages rather than currents could be used to measure the state of the cell.

In any case, one shortcoming of this conventional EEPROM cell 100 is that it may require a first voltage (e.g. 21V) to erase the memory cell (e.g., write a logical "0" to the cell), and a second, different voltage (e.g., 19V) to program the memory cell (e.g., write a logical "1" to the cell) in order to guarantee the same voltages induced on FG during programming and erasing, or in other words, in order to guarantee the same coupling factor. To achieve these different voltages, the memory device requires a voltage divider or similar circuitry. In addition to requiring area on the chip (area corresponds to cost in many respects), this circuitry also may consume additional power. Therefore, to reduce costs and power requirements, the inventors have appreciated that it would be beneficial to use the same voltage to program and erase each memory cell. However, until now, using the same voltage for program and erase operations would provide unnecessary stress on the first transistor 102 (e.g., a tunneling oxide of the first transistor) during programming and even cause it to breakdown in the worst case.

Therefore, the inventors have devised techniques by which the same voltage can be used for program and erase operations while at the same time limiting the stress incurred by the features of the memory cell. In addition, a kind of universal EEPROM cell can be created, where a desired voltage across the tunneling oxide can be controlled/adjusted in an electronic way.

DETAILED DESCRIPTION

Figure 1:
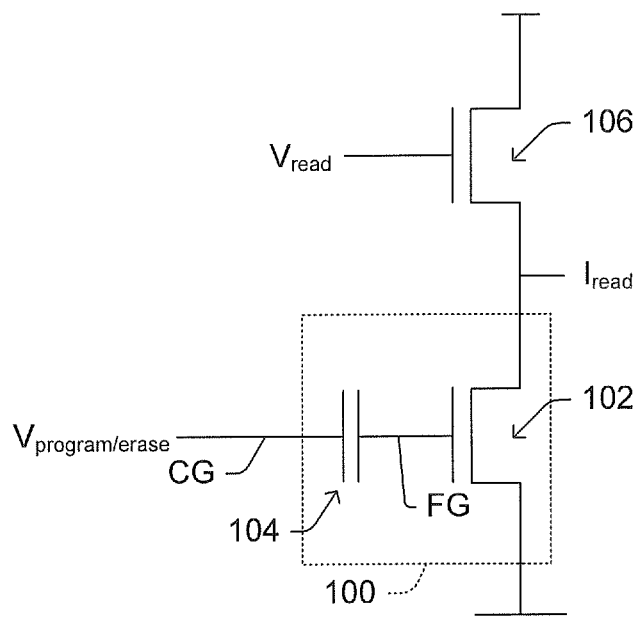
FIG. 1 shows an EEPROM memory in accordance with the prior art.

One or more implementations of the present invention will now be described with reference to the attached drawings, wherein like reference numerals are used to refer to like elements throughout. The drawings are not necessarily drawn to scale.

Various embodiments described below relate to an EEPROM memory cell wherein the same magnitude voltage (albeit with opposite polarity) is used to program and erase the cell. For example, for program operations, 21V can be applied to the cell's control gate and 0V can be applied to the substrate; while for erase operations, 0V can be applied to the cell's control gate and 21 V can be applied to the substrate. Naturally, for erase operations, −21 V can also be applied to the cell's control gate and 0 V can be applied to the substrate, but in that case two different voltage sources may be required. The use of programming and erasing voltages of the same polarity and the same magnitude can be advantageous, for example, because it can limit the amount of circuitry required to establish the program and erase voltages, thereby reducing the overall chip area required and correspondingly decreasing cost and power requirements. But even an application of the equal programming and erasing voltages (of the same polarity and magnitude) does not mean that the potentials on the floating gate induced during programming and erasing will be exactly the same, because the actual potential on the floating gate is also dependent on the potential of the cell environment, e.g. under a lower capacitor plate. As will be appreciated in more detail below, to provide this functionality, some embodiments include a well extending under both a transistor of the EEPROM cell and a capacitor of the EEPROM cell.

Figure 2:
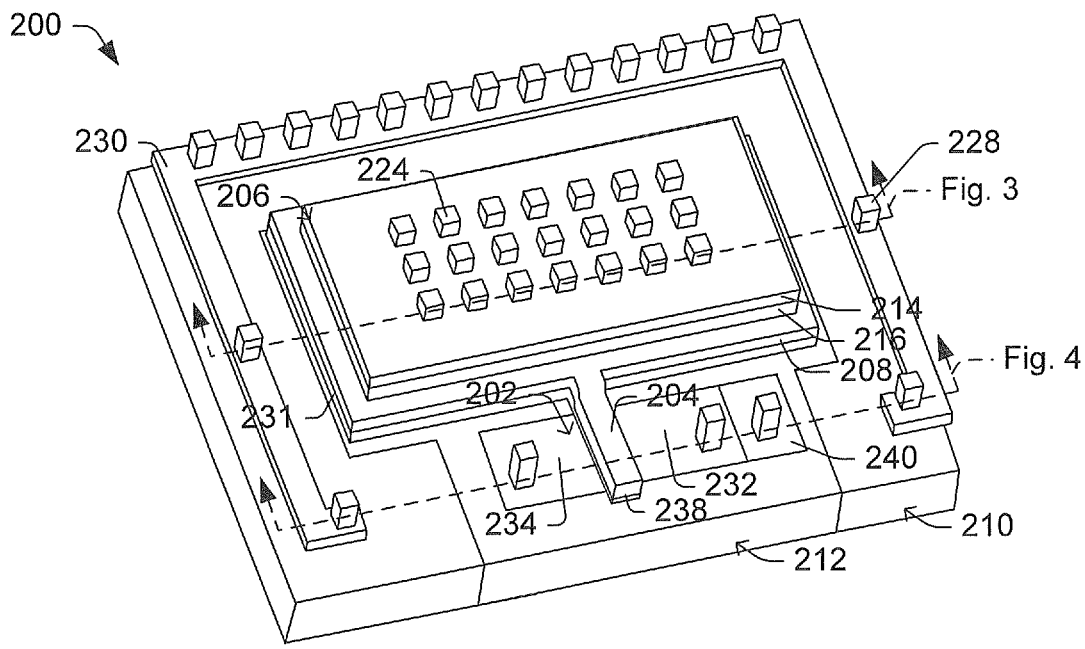
FIG. 2 shows a perspective view of an EEPROM memory cell in accordance with one embodiment.
Figure 3:
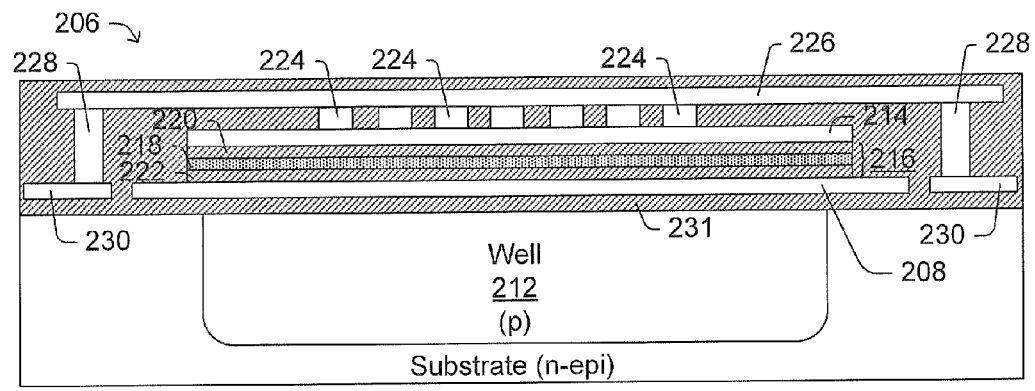
FIG. 3 shows a cross-sectional view of an EEPROM memory cell consistent with FIG. 2 as indicated.
Figure 4:
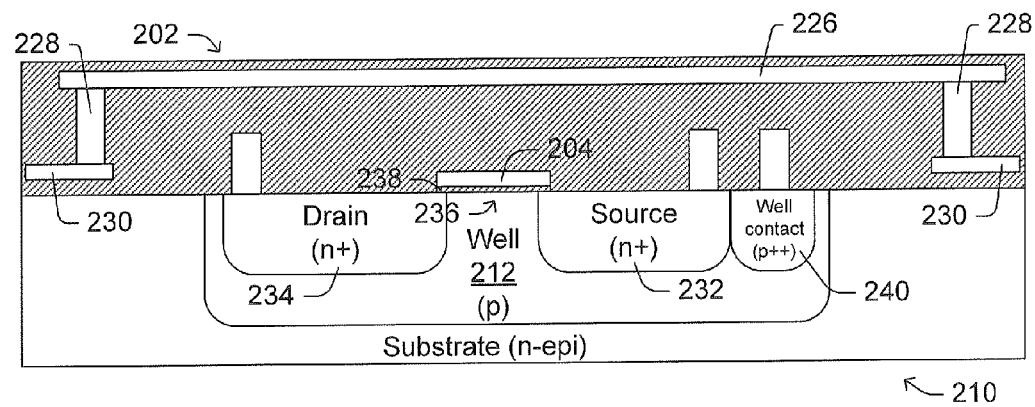
FIG. 4 shows a cross-sectional view of an EEPROM memory cell consistent with FIG. 2 as indicated.

Referring generally to FIGS. 2-4, one can see features of an EEPROM memory cell 200 in accordance with some embodiments of the present invention. Somewhat akin to FIG. 1's previously discussed memory cell 100, the memory cell 200 of FIG. 2 includes a transistor 202 (cross-section shown in FIG. 4) having its gate 204 coupled to a capacitor 206 (cross-section shown in FIG. 3). Again, the transistor's gate 204 and a lower capacitor plate 208 act as a floating gate (FG), while an upper capacitor plate 214 acts as a control gate (CG). However, unlike FIG. 1's implementation, FIG. 2's implementation includes a well region 212 disposed in a substrate 210 on which the transistor and capacitor are formed, wherein the well region 212 extends under both the transistor 202 and capacitor 206. By extending the well region 212 under the capacitor 206, the embodiments described herein alter a coupling constant (or "coupling factor") of the memory cell 200 to make it practical to use the same magnitude voltage, albeit with different polarities with regard to CG, to program and erase the memory cell 200. The structural features of the illustrated memory cell are described in greater detail below. Note that these figures do not show all layers for purposes of clarity.

Referring now to FIG. 2 and FIG. 3, one can see that the capacitor 206 is formed over a first portion of the semiconductor substrate 210. The capacitor 206 includes a first conductive plate 208 and a second conductive plate 214, wherein an insulating layer 216 is disposed between the first and second plates. In some embodiments, the first and second conductive plates 208, 214 are made of poly-silicon, although one or both of the plates could also be made out of another conductive material, such as metal, for example. In addition, in some embodiments the insulating layer 216 includes a nitride layer 218 sandwiched between a first oxide layer 220 and a second oxide layer 222. In other embodiments, the insulating layer 216 can comprise only a single oxide layer, or can include these or other insulating materials. To facilitate program and erase operations, inner vias 224 extend upward from an upper surface of the upper plate 214 to a metal shielding layer 226. Outer vias 228 extend downward from the metal shielding layer 226 to a guard-ring 230 that has an inner perimeter at least partially surrounding the capacitor plates. A field oxide layer 231, which can have a thickness of approximately 1 μm, for example, electrically isolates the lower plate from the substrate. Control circuitry (not shown) is coupled to the upper plate 214 and can supply various voltage conditions to the upper plate 214 to provide desired programming operations as described further herein.

It will be appreciated that a substrate (e.g., substrate 210) can take different forms depending on the implementation. For example, in some embodiments, a substrate is simply a semiconductor wafer (e.g., a silicon wafer) on which the memory cells are formed. In other implementations, however, the substrate can include one or more additional layers in which the memory cells are formed. For instance, in some embodiments, the substrate can include an epitaxial layer (e.g., n-EPI), wherein both the substrate and the additional layers (e.g., n-EPI) can be collectively referred to as a substrate.

Referring now to FIG. 2 and FIG. 4, one can see that the transistor 202 is formed over a second portion of the semiconductor substrate 210, inside of which the well 212 is formed. The transistor 202 includes a source region 232 and a drain region 234, which are separated from one another via a channel region 236 under the floating gate 204. An insulating layer 238, which is often referred to as a gate oxide or tunnel oxide, electrically isolates the channel region 230 from the floating gate 204. In some embodiments, the insulating layer 238 can have a thickness of approximately 7.5 nm to about 15 nm. A well contact 240 is also shown in the cross-section of FIG. 4.

There are commonly-used EEPROM arrays with a bit- and matrix control circuitries. In a circuit with bit a control all the bits can be programmed/erased/read out simultaneously (parallel bit access) whereas in a matrix circuit usually only one bit in a matrix can be programmed/erased/read out at once (a kind of serial bit access). Different control circuitries may require different operating voltages, e.g. a matrix circuitry requires a permanent high voltage on the substrate during programming and erasing in order to prevent breakdown among cells whereas the substrate in a bit controlled circuit can also be connected to ground during programming. Table 1 below shows an example of a bias condition that can be applied by bit controlled circuitry to program the memory cell 200 (e.g., write a logical "1" to the cell):

TABLE 1

Bias condition to program bit controlled EEPROM cell

| Device Pin | Voltage |
| --- | --- |
| Control Gate | 21 V |
| Source | 0 V |
| Drain | Floating |
| Substrate | 0 V or 21 V |
| Well | 0 V |

Table 2 shows another bias condition, which includes a high potential on the substrate, that can be used to program matrix controlled EEPROM cell:

TABLE 2

Bias condition to program matrix controlled EEPROM cell

| Device Pin | Voltage |
| --- | --- |
| Control Gate | 21 V |
| Source | 0 V |
| Drain | Floating |
| Substrate | 21 V |
| Well | 0 V |

Absent countermeasures, the high potential on the substrate can lead to a kind of over-programming, because the potential induced on the floating gate though the coupling factor depends on the parasitic capacitance between the floating gate and substrate, and as a consequence on the potential under a lower poly plate or on the potential of the substrate. The substrate potential should be equal to the well potential during programming and erasing in order to keep the same coupling factor. In FIG. 2's embodiment the extended well region 212, which extends under both the transistor 202 and capacitor 206, prevent this "over-programming" because it provides a low potential under the lower poly plate whereas in a matrix controlled cell without the extended well region the potential under the lower poly plate will be much higher in comparison to the well potential, that causes a higher coupling factor and as a consequence a higher voltage across FG.

The bias conditions in Table 1 and Table 2 provide a relatively large bias across the capacitor 206, which adds electrons to the floating gate 204. This tends to decrease the potential of the floating gate 204 relative to the voltage threshold of the transistor 202. During a subsequent read operation, the memory device can discern the programmed data value by taking a current or voltage measurement, such as previously described with regards to FIG. 1 for example.

Table 3 below shows an example of another bias condition that can erase the bit- and matrix controlled memory cell 200 (e.g., write a logical "0" to the cell):

TABLE 3

Bias condition to erase EEPROM cell

| Device Pin | Voltage |
|---|---|
| Control Gate | 0 V |
| Source | 21 V |
| Drain | Floating |
| Substrate | 21 V |
| Well | 21 V |

The bias conditions in Table 3 remove electrons from the floating gate 204, increasing the potential of the floating gate relative to the voltage threshold of the transistor 102. During a subsequent read operation, the memory device can discern the erased data value by taking a current or voltage measurement, such as previously described with regards to FIG. 1 for example. Because these bias conditions use equal voltage magnitudes to program/erase the cell, the memory device can utilize simplified control circuitry that is more cost effective and which consumes less power than previous solutions.

By switching between these bias conditions, control circuitry can selectively write desired data values to individual memory cells (or to a block of memory cells, depending on the architecture of a memory array in which the memory cell is deployed). It will be appreciated that all voltages are approximate and that ranges of these voltages can vary widely depending on the technology used (the tunneling oxide thickness). Also, although the presence of electrons on floating gate 204/208 has been described above as representing a logical "1" data value, other conventions could also be used. For example, the presence of electrons could be representative of a "0" data value. Similarly, erasing a bit could also write "0" or "1" values to the cell, depending on the convention used.

Although, FIGS. 2-4 show one example of an EEPROM memory cell 200, alterations and/or modifications may be made to the illustrated example without departing from the spirit and scope of the appended claims. For example, although the EEPROM memory cell 200 has been shown with as having an n-type substrate 210, a p-type well region 212, and an n-type source and drain 232/234; in other embodiments these doping conventions could be reversed. For example, the substrate 210 could be p-type, the well region 212 could be n-type, and the source and drain 232/234 could be p-type. In describing the illustrated memory cell 200, the capacitor of the cell was biased with a positive or negative voltage depending on whether the operation was a program or erase condition.

Figure 5:
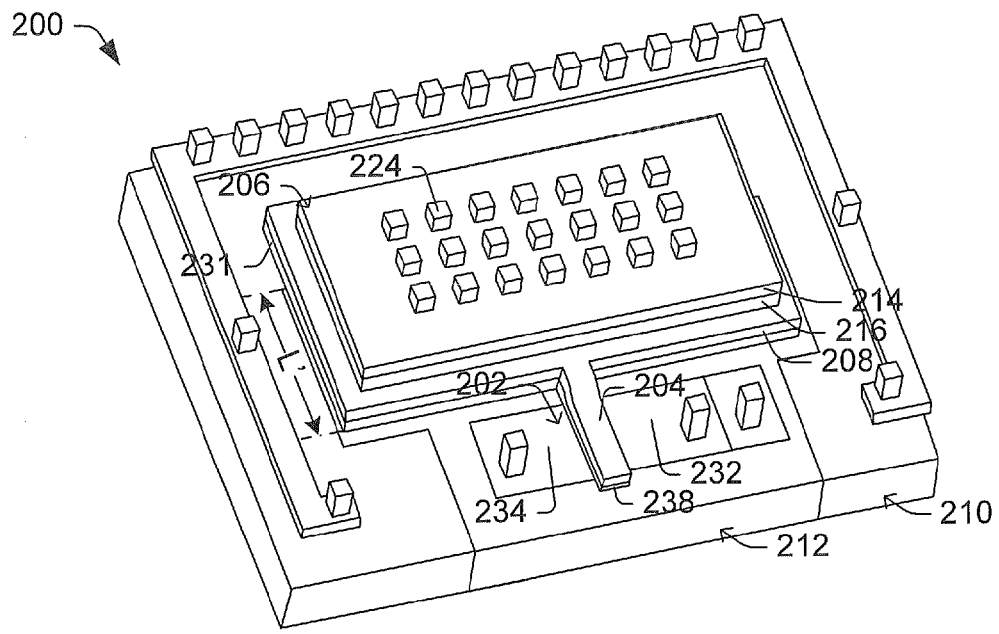
FIGS. 5-6 show EEPROM memory cells in accordance with some embodiments.
Figure 6:
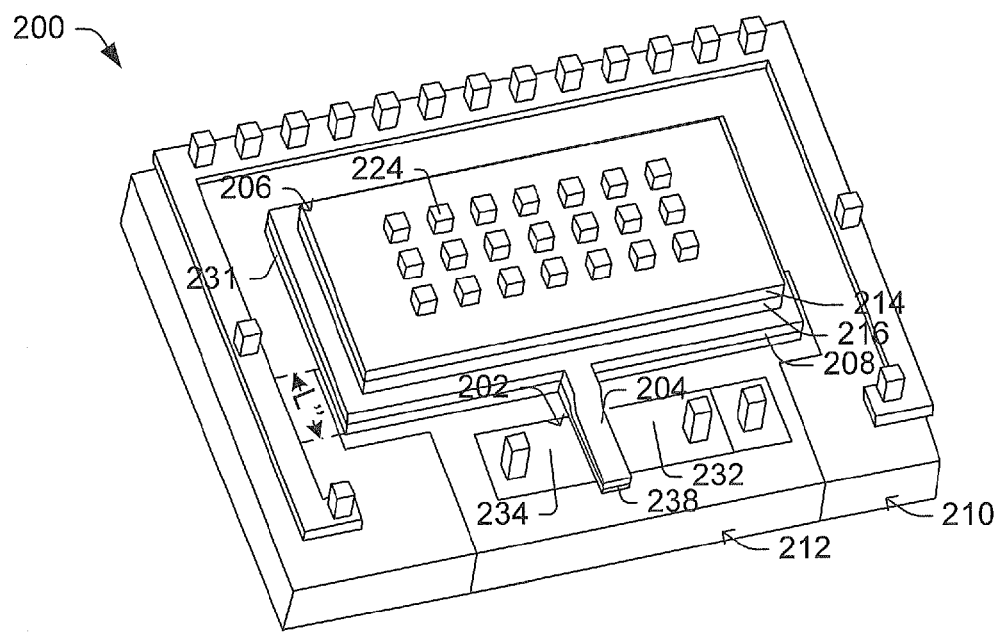

FIGS. 5-6 show two examples of different ways in which a well region 212 can extend under the first and second capacitor plates. In FIG. 5, the well region 212 extends under the first capacitor plate 208 by distance (L'), which represents a majority of the lateral distance between sidewalls of the second capacitor plate. In FIG. 6, the well region 212 extends to a lesser degree by lateral distance (L") between sidewalls of the second capacitor plate 208. Thus, as can be appreciated by the collective teachings of FIG. 2 (where the well region 212 extends completely under second capacitor plate 208) in view of FIGS. 5-6, the well region 212 can extend under the second capacitor plate 206 by different extents depending on the particular implementation. It will be appreciated that each of these implementations will likely have a slightly different coupling constant (or factor), and will therefore slightly tune the bias voltage applied over the tunneling oxide to write data values to the cell. As previously mentioned, it is often desirable to arrange the well region so that the same magnitude voltage can be used, albeit with different polarity, to write different data states to the memory cell, thereby reducing the extent of control circuitry used.

Figure 7:
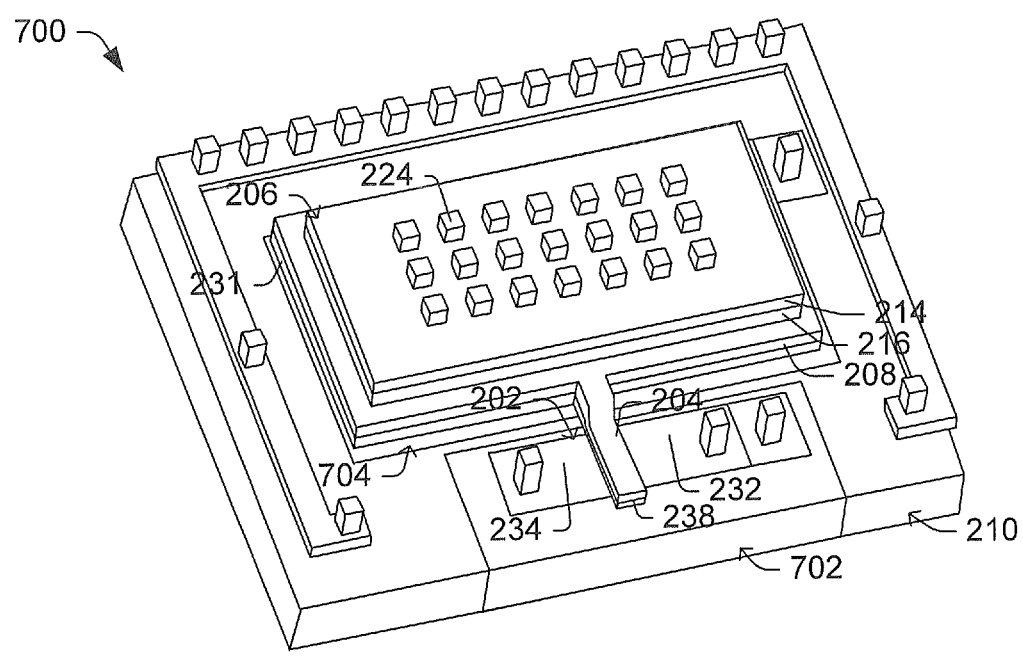
FIG. 7 shows an EEPROM memory cell with first and second well regions in accordance with some embodiments.

As shown in FIG. 7, in some implementations a single EEPROM memory 700 cell can include separate well regions in the substrate—namely, a first well region 702 and a second well region 704. During operation, control circuitry (not shown) can provide different voltages on the first and second well regions 702, 704 during a write operation in which a data value is written to the cell. By using these separate well regions, different coupling factors can be achieved, thereby providing more flexibility when accessing the memory cell than is currently achievable.

Figure 8:
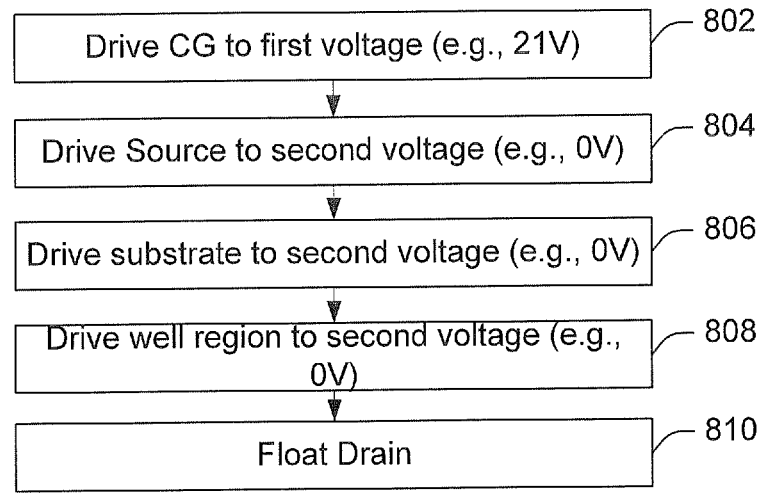
FIGS. 8-9 show methods for writing data values to an EEPROM memory cell in accordance with some embodiments.
Figure 9:
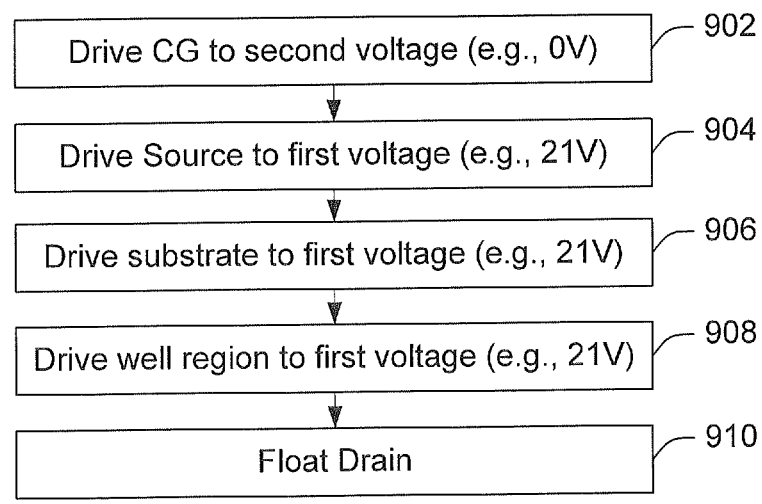

FIGS. 8-9 show some illustrative methods for accessing a memory device. While these methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated. For example, although the schematic representations show a EEPROM memory cell as previous described, it will be appreciated that the aspects of the invention may also apply to other types of memory.

Referring now to FIG. 8, one can see one method 800 for writing a first data value (e.g., a logical "1") to a memory cell. The method starts at 802 when a first voltage (e.g., 21 V) is applied to the control gate CG of the memory cell. At 804, a source of a transistor of the memory cell is driven to a second voltage (e.g., 0V). The substrate and well region are also driven to the second voltage in blocks 806, 808, and the drain is floated at 810. This results in carriers (electrons or holes), being trapped on the floating gate of the memory cell, thereby altering the potential on the floating gate to correspond to the first data value.

Referring now to FIG. 9, one can see one method 900 for writing a second data value (e.g., a logical "0") to the memory cell. The method starts at 902 when the second voltage (e.g., 0 V) is applied to the control gate CG of the memory cell. At 904, a source of a transistor of the memory cell is driven to the first voltage (e.g., 21V). The substrate and well region are also driven to the first voltage in blocks 906, 908, and the drain is floated at 910. This results in carriers (electrons or holes), being removed from the floating gate of the memory cell, thereby altering the potential on the floating gate to correspond to the second data value.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory device, comprising:
a capacitor having a first capacitor plate and a second capacitor plate, wherein the first and second capacitor plates are separated by an insulating layer and are formed over a first portion of a semiconductor substrate;
a transistor having a source region, a drain region, and a gate region, the gate region being coupled to the second capacitor plate; wherein the transistor is formed over a second portion of the semiconductor substrate; and
a well region disposed in the first and second portions of the semiconductor substrate and extending continuously between the first and second portions of the semiconductor substrate, wherein the well region has a doping-type that is opposite a doping-type of the semiconductor substrate.

2. The memory device of claim 1, further comprising:
control circuitry configured to store a first data value in the memory cell by applying a voltage difference across the control gate and the well region, wherein the control gate receives a higher voltage than the well region while the voltage difference is applied to store the first data value; and
wherein the control circuitry is further configured to store a second data value in the memory cell by applying the voltage difference across the control gate and the well region, wherein the control gate receives a lower voltage than the well region while the voltage difference is applied to store the second data value.

3. The memory cell of claim 1, wherein the well region extends in the substrate under at least substantially the entire surface area of first capacitor plate.

4. The memory cell of claim 1, wherein the insulating layer of the capacitor comprises
a first oxide layer proximate to the first capacitor plate;
a second oxide layer proximate to the second capacitor plate; and
a nitride layer sandwiched between the first and second oxide layers.

5. The memory cell of claim 1, further comprising:
a guard ring that at least partially laterally surrounds at least one of the first or second capacitor plates.

6. The memory cell of claim 1, further comprising:
a metal shield layer extending at least substantially over the first and second capacitor plates and over the gate region of the transistor.

7. The memory cell of claim 6, further comprising:
at least one via coupling the metal shield layer to the first capacitor plate.

8. The memory cell of claim 7, further comprising:
a guard ring coupled to the metal shield layer and which at least partially laterally surrounds at least one of the first or second capacitor plates.

9. The memory cell of claim 1, wherein the first and second capacitor plates and the gate region comprise polysilicon.

10. A method of accessing an EEPROM memory cell, comprising:
writing a first data state to the EEPROM memory cell by applying a voltage difference of greater than 10 volts across a capacitor of the EEPROM memory cell, wherein a control gate of the EEPROM cell receives a higher voltage than a well region of the EEPROM cell while the voltage difference is applied to store the first data value; and
writing a second data state to the EEPROM memory cell by applying the voltage difference across the capacitor of the EEPROM cell, wherein the control gate of the EEPROM cell receives a lower voltage than the well region of the EEPROM cell while the voltage difference is applied to store the second data value.

11. The method of claim 10, further comprising:
reading a data state from the EEPROM memory cell by voltage or current sensing the stored charge/potential on the floating gate region of the transistor of the EEPROM memory cell.

12. A method of accessing an EEPROM memory cell, comprising:
writing a first data state to the EEPROM memory cell by driving a control gate of the EEPROM cell to a first voltage and concurrently driving both a substrate and a well under the control gate to a second voltage, where the second voltage is less than the first voltage;
writing a second data state to the EEPROM memory cell by driving the control gate of the EEPROM cell to the second voltage and concurrently driving both the substrate and the well under the control gate to the first voltage, where the second data state is different from the first data state;
wherein a difference between the first and second voltages is greater than approximately 10 volts.

* * * * *